United States Patent
Aisenbrey (10) Patent No.: US 7,222,727 B2
(45) Date of Patent: May 29, 2007

(54) LOW COST FOOD PROCESSING BELTS AND OTHER CONVEYANCES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 148 days.

(21) Appl. No.: 10/823,147

(22) Filed: Apr. 13, 2004

(65) Prior Publication Data

US 2004/0211653 A1    Oct. 28, 2004

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/484,400, filed on Jul. 2, 2003, provisional application No. 60/462,891, filed on Apr. 15, 2003, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*B65G 43/06* (2006.01)
*G08B 21/00* (2006.01)

(52) U.S. Cl. .................... 198/810.04; 198/810.02; 198/810.03; 340/676; 156/137

(58) Field of Classification Search ........... 198/810.02, 198/810.03, 810.04; 340/676; 156/137
See application file for complete search history.

(56) References Cited

U.S. PATENT DOCUMENTS 2,587,158 A    2/1952  Hofberg .................. 209/81

(Continued)

FOREIGN PATENT DOCUMENTS

EP    733338 A    7/1955

(Continued)

OTHER PUBLICATIONS

"Fundamental Understanding of Conductivity Establishment for Electrically, Conductive Adhesives," Kianhua et al., Proc. of 52nd Electron. Comp. and Tech. Conf., 2002, pp. 1154-1157.

(Continued)

*Primary Examiner*—Douglas A. Hess
(74) *Attorney, Agent, or Firm*—Douglas Schnabel (57) ABSTRACT

Conveyors, chutes, skids, guides, and ways for the transporting of material are formed of a conductive loaded resin-based material such that fragments of these structures can be detected by a metal detector. The conductive loaded resin-based material comprises micron conductive powder(s), conductive fiber(s), or a combination of conductive powder and conductive fibers in a base resin host. The ratio of the weight of the conductive powder(s), conductive fiber(s), or a combination of conductive powder and conductive fibers to the weight of the base resin host is between about 0.20 and 0.40. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders.

28 Claims, 5 Drawing Sheets

U.S. PATENT DOCUMENTS

| | | | |
|---|---|---|---|
| 3,542,633 A | 11/1970 | Goldsmith | 161/87 |
| 3,731,113 A * | 5/1973 | Lowe et al. | 198/810.02 |
| 3,899,071 A * | 8/1975 | Duffy | 198/810.02 |
| 4,020,945 A * | 5/1977 | Takeno et al. | 198/810.02 |
| 4,197,218 A * | 4/1980 | McKaveney | 252/503 |
| 4,205,536 A | 6/1980 | Kasahara | 62/380 |
| 4,538,898 A * | 9/1985 | Kanno et al. | 399/274 |
| 4,569,786 A | 2/1986 | Deguchi | 252/503 |
| 4,653,633 A * | 3/1987 | Jacobs | 198/810.02 |
| 4,705,702 A * | 11/1987 | Shimada et al. | 427/180 |
| 4,778,636 A | 10/1988 | Krieg et al. | 264/105 |
| 4,882,089 A | 11/1989 | Iwaskow et al. | 428/242 |
| 5,049,332 A | 9/1991 | Ziemer et al. | 264/104 |
| 5,168,266 A * | 12/1992 | Fukuda | 340/676 |
| 5,286,542 A | 2/1994 | Susi et al. | 428/58 |
| 5,744,090 A * | 4/1998 | Jones et al. | 264/427 |
| 6,047,814 A * | 4/2000 | Alles et al. | 198/810.02 |
| 6,113,482 A | 9/2000 | Licata | 452/40 |
| 6,162,536 A | 12/2000 | Montsinger | 428/372 |
| 6,277,303 B1 | 8/2001 | Foulger | 252/500 |
| 6,291,991 B1 | 9/2001 | Schnell | 324/235 |
| 6,332,149 B1 * | 12/2001 | Warmus et al. | 715/517 |
| 6,368,704 B1 | 4/2002 | Murata et al. | 428/323 |
| 6,440,593 B2 * | 8/2002 | Ellison et al. | 428/294.1 |
| 6,581,755 B1 * | 6/2003 | Wilke et al. | 198/810.03 |
| 6,602,446 B2 | 8/2003 | Ushijima | 252/512 |
| 6,704,535 B2 * | 3/2004 | Kobayashi et al. | 399/308 |
| 6,741,221 B2 * | 5/2004 | Aisenbrey | 343/897 |
| 6,870,516 B2 * | 3/2005 | Aisenbrey | 343/873 |
| 6,953,619 B2 * | 10/2005 | Dean et al. | 428/297.4 |

FOREIGN PATENT DOCUMENTS

| | | |
|---|---|---|
| EP | 0063533 | 3/1982 |
| EP | 0063533 A | 10/1982 |
| EP | 0350206 A | 1/1990 |
| EP | 0700843 A | 3/1996 |
| EP | 1298398 A | 4/2003 |
| GB | 2377449 A | 1/2003 |

OTHER PUBLICATIONS

INTRALOX Inc. USA 201 Laitram Ln., Harahan Louisiana, 70123, Ammeraal Beltech, 75011 N. St. Louis Ave., Skokie, Il 60076, & Siegling America, Inc., 12201 Vanstorg Rd., Huntersville, NC 28078.

"Nanocomposite Materials Offer Higher Conductivity and Flexibility," by McCluskey, et al., Proceedings of 3rd Int'l Conf. on Adhesive Joining and Coating Tech. in Electronics Manuf. 1998, pp. 282-286.

Cassel Messtechnik GmbH, Carl-Gieseck-Str. 3, 37079 Gottingen, Germany.

* cited by examiner

LOW COST FOOD PROCESSING BELTS AND OTHER CONVEYANCES MANUFACTURED FROM CONDUCTIVE LOADED RESIN-BASED MATERIALS

This Patent Application claims priority to the U.S. Provisional Patent Application No. 60/462,891, filed on Apr. 15, 2003, and to the U.S. Provisional Patent Application No. 60/484,400, filed on Jul. 2, 2003, which are herein incorporated by reference in their entirety.

This Patent Application is a Continuation-in-Part of, filed as U.S. patent application Ser. No. 10/309,429, filed on Dec. 4, 2002 now U.S. Pat. No. 6,870,516, also incorporated by reference in its entirety, which is a Continuation-in-Part application of, filed as U.S. patent application Ser. No. 10/075,778, filed on Feb. 14, 2002 now U.S. Pat No. 6,471,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to conveyor belts and, more particularly, to food processing belts and other conveyances molded of conductive loaded resin-based materials comprising micron conductive powders, micron conductive fibers, or a combination thereof, homogenized within a base resin when molded.

(2) Description of the Prior Art

Conveyors, chutes, skids, guides, and ways for the transporting of material and articles of manufacturing are well known in the art. In the food processing industry, conveyors are used for warming and cooling food products, slicing and bagging, in-feed and discharge. The conveyor belts are generally constructed of a plastic resin such as Polypropylene, Polyethylene, Acetal, or the like, or may be constructed of a metal wire frame with an over-molded plastic resin. The conveyor belts allow processed material to be transported while remaining level and flat. Conveyors, chutes, skids, guides, and ways may be fabricated to be electrically conductive to dissipate static electricity, may be heat resistant for use in high temperature processing of food, may be moisture tolerant for wet environments, may be impact resistant to prevent breakage of glass food packaging, and may be flame retardant to prevent sustaining a flame.

A problem that may occur with plastic resin belts or with metal wire frame belts that are covered in plastic resin is wear-out induced contamination. As the plastic resin material wears out, particulate material from the plastic resin may brake away from the belt. As a result, it is possible for this material to contaminate a food item being processed on the belt. This contamination is undesirable both in terms of food safety and of consumer acceptance.

Several prior art inventions relate to Conveyors, chutes, skids, guides, and ways and to items comprising conductive plastics. U.S. Pat. No. 6,368,704 to Murata, et al provides a conductive paste that exhibits a high thermal conductivity (a low thermal resistance) after adhesion and hardening that enables an adhesive layer to be thinly formed and provides an electronic part that has an excellent radiating capability that enables the film's thickness to be reduced. U.S. Pat. No. 6,277,303 to Foulger describes conductive polymer composite materials. The conductive polymer composite material includes a minor phase material that has a semicrystalline polymer. The composite material further includes a conductive filler material dispersed in the minor phase material in an amount sufficient to be equal to or greater than an amount required to generate a continuous conductive network within the minor phase material. U.S. Pat. No. 4,197,218 to McKaveney describes electrically conductive articles. The articles are formed of a non-conductive matrix containing an electrically conductive dispersion of finely divided ferroalloy, silicon alloy, or mixtures. U. S. Pat. No. 6,602,446 to Ushijima provides an electrically conductive paste made up of an electrically conductive filler and a conveyor belt adapted to generate heat by electromagnetic induction are compounded with a resin.

INTRALOX Inc. USA, 201 Laitram Lane, Harahan, La. 70123, Ammeraal Beltech, 75011 N. St. Louis Ave., Skokie, Ill. 60076, and Siegling America, Inc., 12201 Vanstory Road, Huntersville, N.C. 28078 are manufacturers of conveyor belting. Each manufacturer describes conductive belting manufactured of plastic resins with embedded conductors. Cassel Messtechnik GmbH, Carl-Giesecke-Str. 3, 37079 Göttingen, Germany manufactures a metal detector for the food industry. The metal detector operates on the basis of an inductive measuring principle. A high-frequency electromagnetic alternating field is generated by a transmitter coil. If a metal piece passes through the metal detector, the field experiences a change corresponding to the magnetic and electrical properties of the metal piece. In the article by McCluskey, et al., "Nanocomposite Materials Offer Higher Conductivity and Flexibility", Proceedings of 3rd International Conference on Adhesive Joining and Coating Technology in Electronics Manufacturing, 1998, pp: 282–286, the mechanical and electrical characteristics of a conductive polymer made with conductive silver flake nanoparticle fillers is described. In the article by Fan et al., "Fundamental Understanding of Conductivity Establishment for Electrically Conductive Adhesives," Proceedings of the 52nd Electronic Components and Technology Conference, 2002, pp: 1154–1157, several epoxy resin based curing systems are described.

SUMMARY OF THE INVENTION

A principal object of the present invention is to provide effective food processing belts and other conveyances.

A further object of the present invention is to provide a method to form food processing belts and other conveyances.

A further object of the present invention is to provide a food processing belts and other conveyances that are detectable by typical metal detection devices.

A yet further object of the present invention is to provide a food processing belts and other conveyances molded of conductive loaded resin-based material where the belt characteristics can be altered or the visual characteristics can be altered by forming a metal layer over the conductive loaded resin-based material.

A yet further object of the present invention is to provide methods to fabricate food processing belts and other conveyances from a conductive loaded resin-based material incorporating various forms of the material.

A yet further object of the present invention is to provide a method to fabricate food processing belts and other conveyances from a conductive loaded resin-based material where the material is in the form of a fabric.

In accordance with the objects of this invention, a conveying belt device is achieved. The device comprises a loop structure of a conductive loaded, resin-based material comprising conductive materials in a base resin host. The belt or fragments of the belt are detectable by a metal detection device.

Also in accordance with the objects of this invention, a food processing conveying apparatus is achieved. The apparatus comprises a belt of a conductive loaded, resin-based material comprising conductive materials in a base resin host. A metal detector is included such that the belt or fragments of the belt are detectable by the metal detection device.

Also in accordance with the objects of this invention, a method to form a conveying belt device is achieved. The method comprises providing a conductive loaded, resin-based material comprising conductive materials in a resin-based host. The conductive loaded, resin-based material is molded into a conveying belt device comprising a loop structure of a conductive loaded, resin-based material comprising conductive materials in a base resin host. The conveying belt or fragments of the conveying belt are detectable by a metal detection device.

BRIEF DESCRIPTION OF THE DRAWINGS

In the accompanying drawings forming a material part of this description, there is shown.

DESCRIPTION OF THE PREFERRED EMBODIMENTS

This invention relates to food processing belts and other conveyances molded of conductive loaded resin-based materials comprising micron conductive powders, micron conductive fibers, or a combination thereof, homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of food processing belts and other conveyances fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the food processing belts and other conveyances devices are homogenized together using molding techniques and or methods such as injection molding, over-molding, thermo-set, protrusion, extrusion, calendaring, or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

The use of conductive loaded resin-based materials in the fabrication of food processing belts and other conveyances significantly lowers the cost of materials and the design and manufacturing processes used to hold ease of close tolerances, by forming these materials into desired shapes and sizes. The food processing belts and other conveyances can be manufactured into infinite shapes and sizes using conventional forming methods such as injection molding, over-molding, or extrusion, calendaring, or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or in any combination thereof, which are homogenized together within the base resin, during the molding process, yielding an easy to produce low cost, electrically conductive, close tolerance manufactured part or circuit. The micron conductive powders can be of carbons, graphites, amines or the like, and/or of metal powders such as nickel, copper, silver, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding or extrusion or calendaring to create desired shapes and sizes. The molded conductive loaded resin-based materials can also be stamped, cut or milled as desired to form create the desired shape form factor(s) of the heat sinks. The doping composition and directionality associated with the micron conductors within the loaded base resins can affect the electrical and structural characteristics of the food processing belts and other conveyances and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming food processing belts and other conveyances. When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in food processing belts and other conveyances applications as described herein.

The homogeneous mixing of micron conductive fiber and/or micron conductive powder and base resin described in the present invention may also be described as doping. That is, the homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the homogeneous mixing of micron conductive fiber and/or micron conductive powder into a base resin.

As an additional and important feature of the present invention, the molded conductor loaded resin-based material exhibits excellent thermal dissipation characteristics. Therefore, food processing belts and other conveyances manufactured from the molded conductor loaded resin-based material can provide added thermal dissipation capabilities to the application. For example, heat can be dissipated from electrical devices physically and/or electrically connected to food processing belts and other conveyances of the present invention.

Another important feature of the present invention is that the conductive loaded resin-based material is capable of compliance to FDA regulations for use in food processing and packaging applications, USDA-FSIS regulations for meat and poultry processing, and USDA regulations for dairy processing. In particular, stainless steel, which is used herein as a conductive loading material, is approved by the FDA for use in food processing conveyances.

Figure 1A:
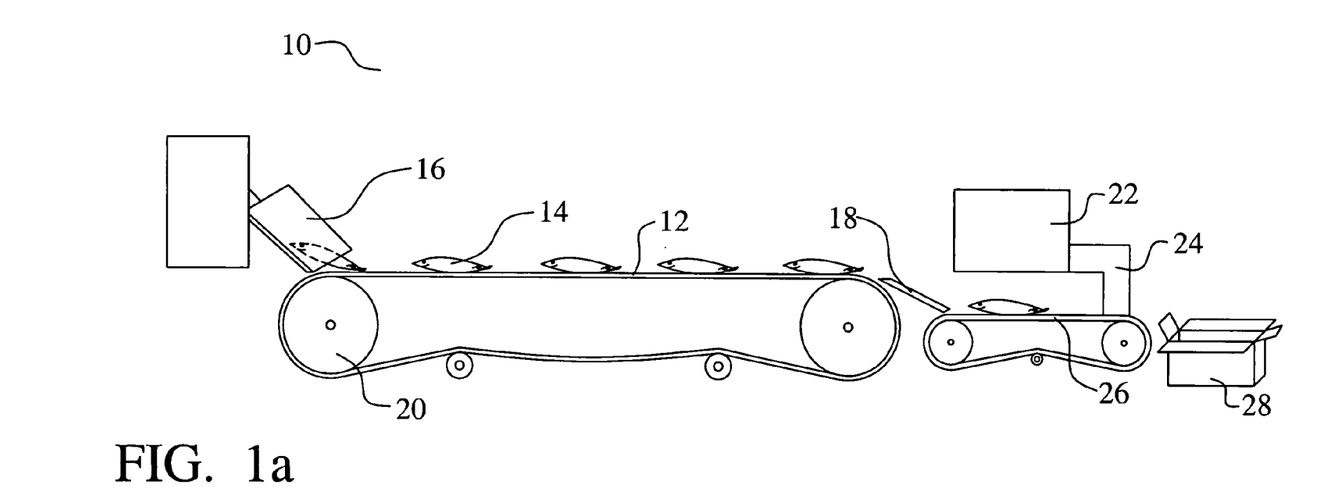
FIGS. 1a and 1b illustrate a first preferred embodiment of the present invention showing a food processing line with belts and other conveyances comprising conductive loaded resin-based material.
Figure 1B:
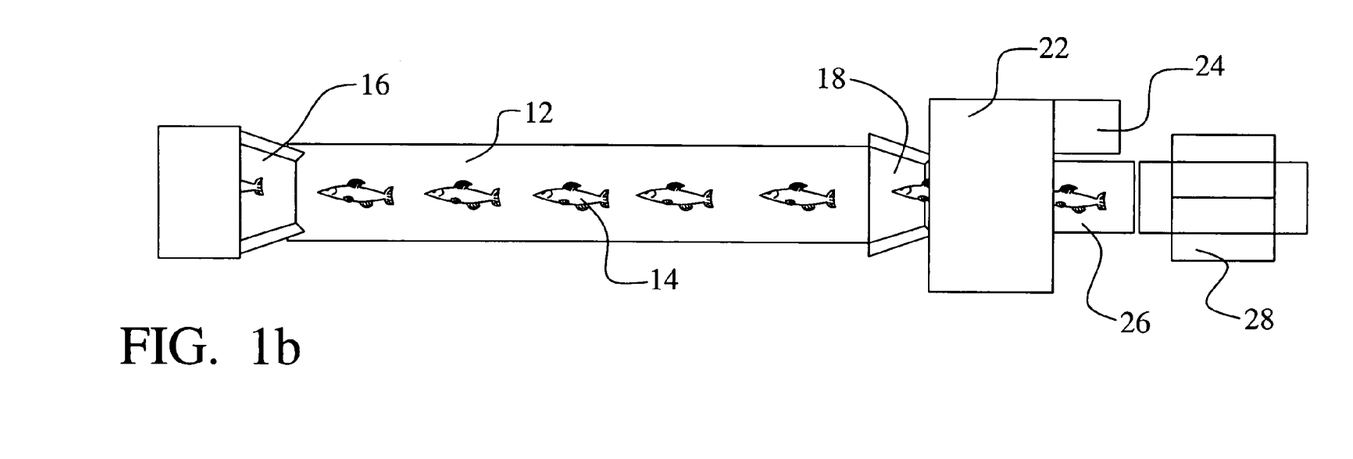
Figure 7:
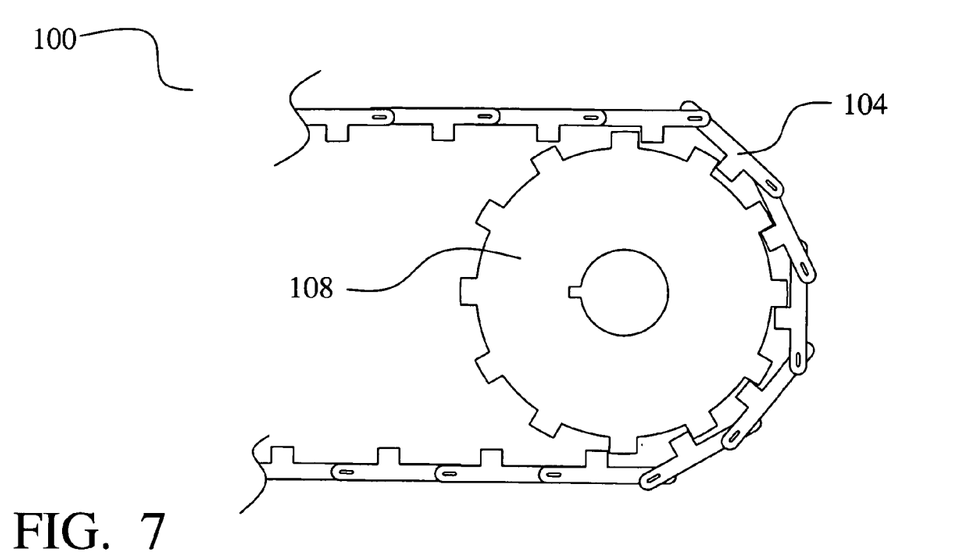
FIG. 7 illustrates a second preferred embodiment of the present invention further showing a conductive loaded resin-based food processing belt with positive drive.
Figure 8:
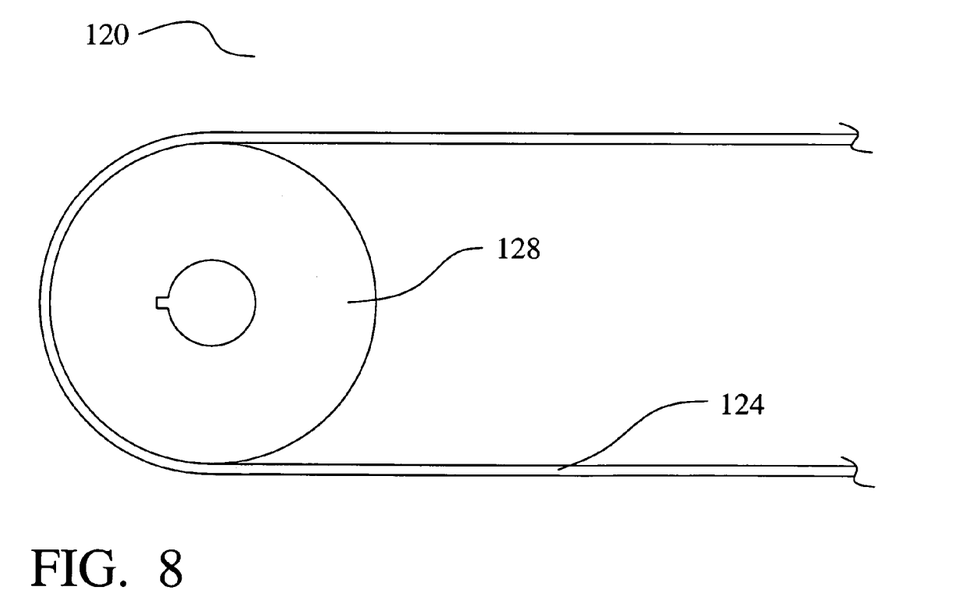
FIG. 8 illustrates a third preferred embodiment of the present invention further showing a conductive loaded resin-based food processing belt with friction rolling drive.

Referring now to FIGS. 1a and 1b, a first preferred embodiment of the present invention is illustrated. Several important features of the present invention are shown and discussed below. Referring now to FIGS. 1a and 1b, a conveyor system 10 for food processing is shown. Several components typical to a food processing conveyor system are depicted. First, the conveyor system 10 comprises a conveyor belt 12 that is constructed of conductive loaded resin-based material according to the present invention. The conveyor belt 12 may comprise a series of linked sections as is depicted in FIG. 7 or may comprise a continuous belt of material as is illustrated in FIG. 8. Referring again to FIGS. 1a and 1b, the conveyor system 10 may further comprises chutes 16 and 18, skids, or other ways of transporting the food items along the processing path. In the preferred embodiment, all or part of these items 16 and 18 also comprise conductive loaded resin-based material according to the present invention. A motor, not shown, is coupled to the sprockets or rollers 20 of the conveyor 10. As the sprockets or rollers 20 are turned by the motor, the belt 12 is pulled in a continuous loop structure. In turn, the moving belt 12 causes in process food items placed onto the belt 12 to be propelled forward through the processing flow of operations such as warming or cooling of the food products 14 or slicing and packaging of the food products 14 or the like.

During processing operations and/or as a result of normal wearing, occasionally a fragment of a conveyor belt 12 may break away from the conveyor belt 12. Typically, such fragments will fall to the floor where they can be removed by normal cleaning operations. However, on occasion, these fragments may contaminate the food product 14. It is critical to the food processor that any such contaminated food product 14 be detected and removed from the processing apparatus 10 prior to packaging 28 and shipping product to consumers. As a particularly important feature of the present invention, the conductive loaded material of the conductive loaded resin-based material comprises conductive material, such as metal, that is detectable in a metal detection device 22. Metal detection devices 22 are well known in that art as recited above. Further, the homogeneous blending of the conductive material into the base resin during the molding process insures that any fragments that break away from the belt 12 will contain detectable metallic content. Therefore, in the preferred embodiment apparatus 10, the food items 14 are caused to pass through a metal detector device 22 prior to final packaging 28. The conveying apparatus at the metal detector 22 preferably comprises a belt 26 with no metallic content so that the metal detector 22 will trigger based only on the food item 14 and any contaminants that are traveling down the conveyor with food item 14. If the metal detector 22 detects metal content in the food item 14, then a sorting mechanism 24 is used to divert the food item 14 and its contamination from the final packaging 28. The use of the novel conductive loaded resin-based belt allows the metal detector to detect and to remove the contamination caused by belt wearing and breakage. Additional, the conductive loaded resin-based material of the belt 12, and of any other conveyance item 16 and 18 in the apparatus 10, can be grounded to provide electrostatic discharge protection. As an additional feature, while maintaining metal detection capability, the belt 12 will possess excellent corrosion and electrolysis resistance. Finally, the conductive loaded resin-based material is an excellent thermal conductor in assisting in rapid thermal transfer to and from the food product during the process.

Referring now to FIG. 7 a second preferred embodiment 100 of the present invention is illustrated. A conductive loaded resin-based food processing belt with positive drive apparatus is illustrated. This conveying system 100 shown comprises a segmented belt 104. This segmented belt comprises a plurality of molded conductive loaded resin-based segments 104 that are interconnected by pivoting or pinned joints. The segments 104 are shaped to interlock or couple to a toothed sprocket 108. This positive drive apparatus 100 is similar to a bicycle drive mechanism and provides a non-slipping propulsion of the conveying belt 104. Preferably, the conductive loaded resin-based material is injection molded to produce a plurality of segments 104 which are then coupled together to form the belt. Alternatively, the conductive loaded resin-based material may be extrusion molded to produce a very wide piece bearing the segmental cross section. This piece can then be cut into segments 104 of desired width. As an additional, though optional feature of this embodiment, the sprocket 108 may comprise conductive loaded resin-based material. This conductive loaded resin-based material may be injection molded to form the sprocket 108. As an additional, though optional feature, each segment 104 may further comprise a metal hinge that is embedded into or molded into the molded conductive loaded resin-based material.

Referring now to FIG. 8, a third preferred embodiment of the present invention is illustrated. In this case, a continuous belt 124 of conductive loaded resin-based material is formed. The belt 124 is propelled using a friction rolling drive 128. In this case, a rotating roller 128 is held in position against the belt 124. More preferably, a tensioning mechanism insures that the roller 128 presses against the belt 124 to thereby create sufficient frictional coupling between roller 128 and belt 124. The belt 124 may be formed by extrusion molding a flexible conductive loaded resin-based material into a sheet or strip, and then joining the ends of a long section of the material to form a belt. To derive a flexible material, the base resin should be one that remains flexible at the operating temperature after molding. The ends may be bound together by, for example, ultrasonic welding. As another alternative, a calendaring method may be used to homogeneously mix the conductive loaded material into the resin-base material prior to molding and curing.

Figure 5A:
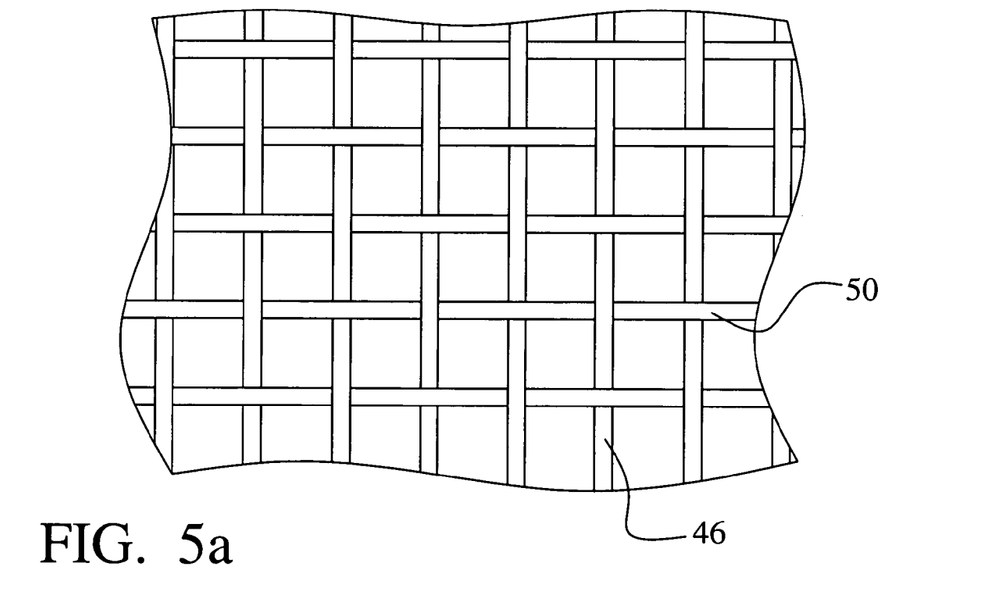
FIGS. 5a and 5b illustrate a fourth preferred embodiment wherein conductive fabric-like materials are formed from the conductive loaded resin-based material.
Figure 5B:
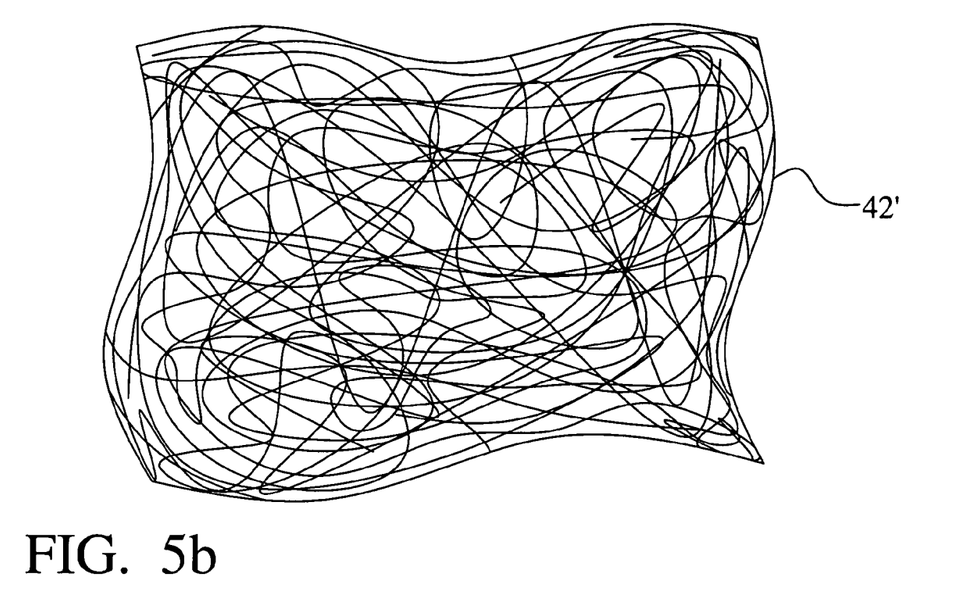

Alternatively, the conductive loaded resin-based material may be formed into fabric-like material as is described below and is illustrated in FIGS. 5a and 5b. This fabric-like material has high strength and maintains the metal detection capability. This fabric-like material may be easily stacked or laminated onto other materials and may be bonded to itself to complete the belt using, for example, ultrasonic welding.

As another alternative, a metal layer, not shown, may be formed on the conveying belt or any other conveying structure comprising the conductive loaded resin-based material described herein. The belt characteristics can be altered or the visual characteristics can be altered by forming a metal layer over the conductive loaded resin-based material. If used, the metal layer may be formed by plating or by coating. If the method of formation is metal plating, then the resin-based structural material of the conductive loaded, resin-based material is one that can be metal plated. There are very many of the polymer resins that can be plated with metal layers. For example, GE Plastics, SUPEC, VALOX, ULTEM, CYCOLAC, UGIKRAL, STYRON, CYCOLOY are a few resin-based materials that can be metal plated. The metal layer may be formed by, for example, electroplating or physical vapor deposition.

Other food conveyance structures, such as the chutes or guides 16 and 18 illustrated in FIGS. 1a and 1b, can easily be molded from the conductive loaded resin-based material. In this way, any material loss due to wear and/or breakage will be detectable by a metal detection device.

Figure 2:
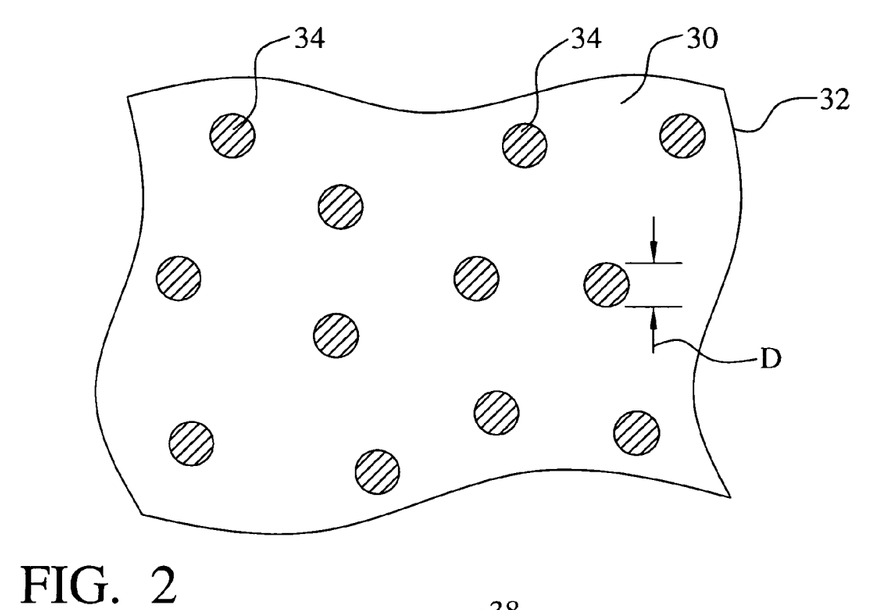
FIG. 2 illustrates a first preferred embodiment of a conductive loaded resin-based material wherein the conductive materials comprise a powder.

The conductive loaded resin-based material typically comprises a micron powder(s) of conductor particles and/or in combination of micron fiber(s) homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
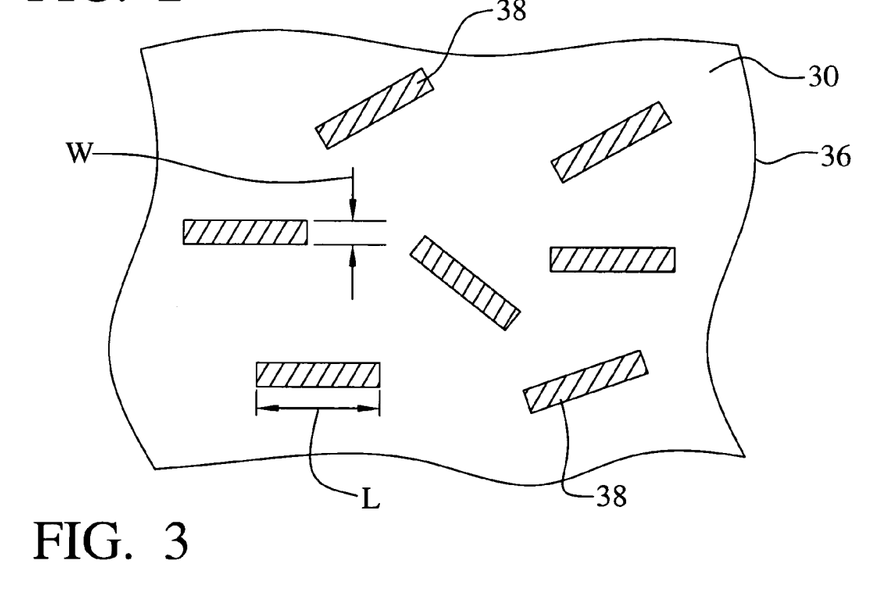
FIG. 3 illustrates a second preferred embodiment of a conductive loaded resin-based material wherein the conductive materials comprise micron conductive fibers.
Figure 4:
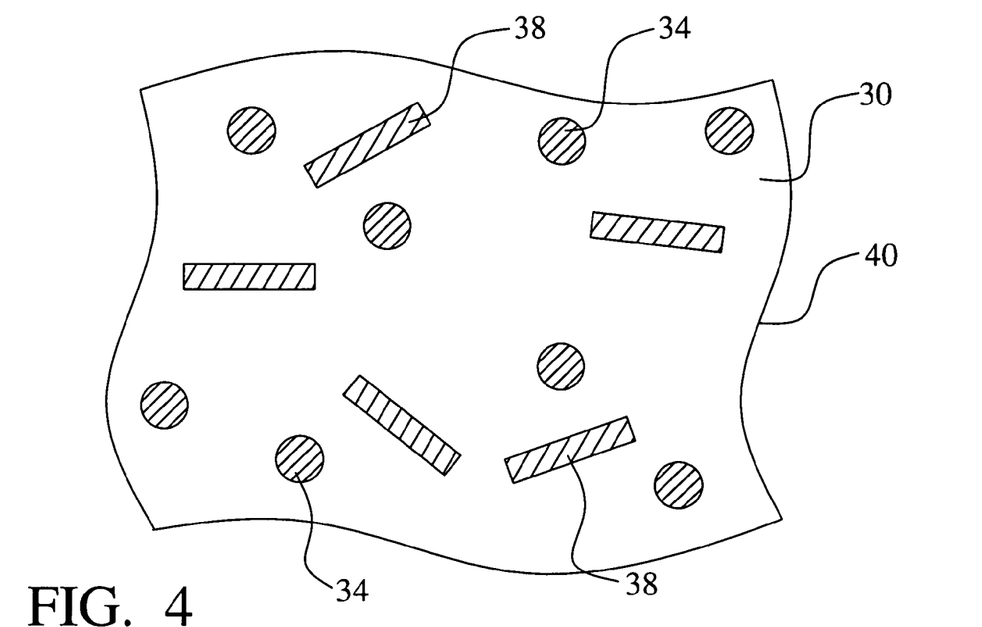
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, or other suitable metals or conductive fibers, or combinations thereof. These conductor particles and or fibers are homogenized within a base resin. As previously mentioned, the conductive loaded resin-based materials have a resistivity between about 5 and 25 ohms per square, other resistivities can be achieved by varying the doping parameters and/or resin selection. To realize this resistivity the ratio of the weight of the conductor material, in this example the conductor particles 34 or conductor fibers 38, to the weight of the base resin host 30 is between about 0.20 and 0.40, and is preferably about 0.30. Stainless Steel Fiber of 8–11 micron in diameter and lengths of 4–6 mm with a fiber weight to base resin weight ratio of 0.30 will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 homogenized together within the resin base 30 during a molding process.

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figure 6A:
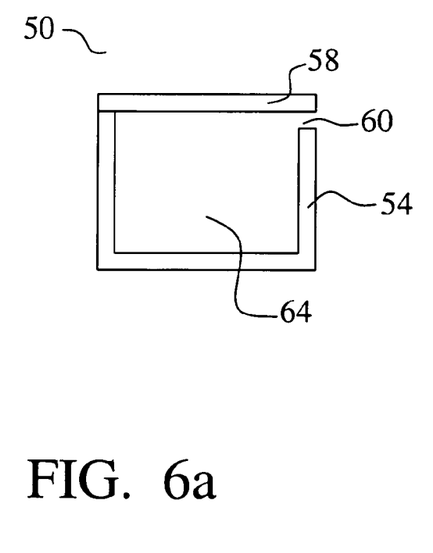
FIGS. 6a and 6b illustrate, in simplified schematic form, an injection molding apparatus and an extrusion molding apparatus that may be used to mold food processing belts and other conveyances of a conductive loaded resin-based material.

Food processing belts and other conveyances formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the homogenized conductive material cures by thermal reaction. The upper portion 58 and lower portion 54 of the mold are then separated or parted and the food processing belts or other conveyances is removed.

Figure 6B:
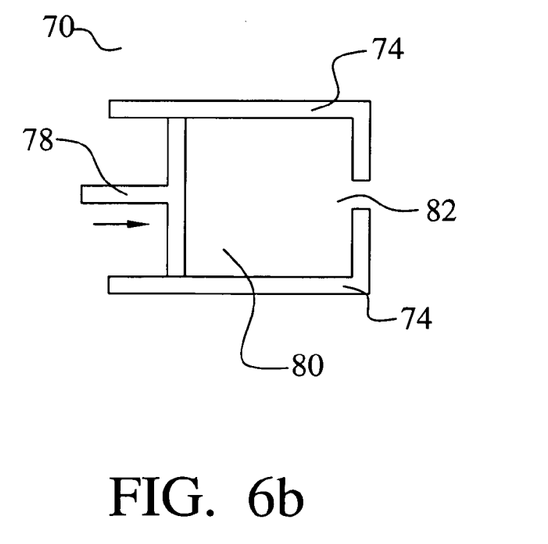

FIG. 6b shows a simplified schematic diagram of an extruder 70 for forming food processing belts and other conveyances using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use.

The advantages of the present invention may now be summarized. Effective food processing belts and other conveyances are achieved. Methods to form food processing belts and other conveyances are achieved. Food processing belts and other conveyances that are detectable by typical metal detection devices are achieved. The belt characteristics can be altered or the visual characteristics can be altered by forming a metal layer over the conductive loaded resin-based material. Methods to fabricate food processing belts and other conveyances from a conductive loaded resin-based material incorporating various forms of the material are achieved. A method to fabricate food processing belts and other conveyances from a conductive loaded resin-based material where the material is in the form of a fabric is achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A conveying belt device comprising a loop structure of a conductive loaded, resin-based material comprising micron conductive fiber, metal powder, and nonmetal powder substantially homogenized within a base resin host wherein said belt or fragments of said belt are detectable by a metal detection device.

2. The device according to claim 1 wherein the ratio, by weight, of said micron conductive fiber to said resin host is between about 0.20 and about 0.40.

3. The device according to claim 1 wherein said metal powder is nickel, copper, or silver.

4. The device according to claim 1 wherein said metal powder is a non-conductive material with a metal plating.

5. The device according to claim 4 wherein said metal plating is nickel, copper, silver, or alloys thereof.

6. The device according to claim 1 wherein said metal powder comprises a diameter of between about 3 μm and about 12 μm.

7. The device according to claim 1 wherein said micron conductive fiber comprises non-conductive core material with a metal plating.

8. The device according to claim 1 wherein said micron conductive fiber is nickel plated carbon fiber, stainless steel fiber, copper fiber, silver fiber or combinations thereof.

9. The device according to claim 8 wherein said micron conductive fiber has a diameter of between about 3 μm and about 12 μm and a length of between about 2 mm and about 14 mm.

10. The device according to claim 1 wherein said conductive loaded resin-based material is a fabric.

11. The device according to claim 1 wherein said device comprises a plurality of connected segments of said conductive loaded resin-based material.

12. The device according to claim 11 further comprising a metal hinge embedded in each said segment.

13. The device according to claim 1 wherein said base resin comprises a flame-retardant material.

14. The device according to claim 1 further comprising a metal layer overlying said conductive loaded resin-based material.

15. A food processing conveying apparatus comprising:
a belt of a conductive loaded, resin-based material comprising micron conductive fiber substantially homogenized within a base resin host wherein said micron conductive fiber comprises a non-conductive core material with a metal plating; and
a metal detector wherein said belt or fragments of said belt are detectable by said metal detector.

16. The apparatus according to claim 15 wherein the ratio, by weight, of said micron conductive fiber to said resin host is between about 0.20 and about 0.40.

17. The apparatus according to claim 15 further comprising metal powder.

18. The apparatus according to claim 17 wherein said metal powder is a non-conductive material with a metal plating.

19. The apparatus according to claim 15 further comprising a combination of metal powder and non-metal powder.

20. The apparatus according to claim 15 wherein said conductive loaded resin-based material is a fabric.

21. The apparatus according to claim 15 wherein said belt comprises a plurality of segments of said conductive loaded resin-based material.

22. The apparatus according to claim 21 further comprising a metal hinge embedded in each said segment.

23. The apparatus according to claim 21 further comprising a drive sprocket coupled to said belt wherein said drive sprocket comprises said conductive loaded resin-based material.

24. The apparatus according to claim 15 wherein said belt comprises a continuous piece of said conductive loaded comrpises a continuous piece of said conductive loaded resin-based material formed by binding together to opposite ends of said conductive loaded resin-based material.

25. The apparatus according to claim 24 wherein said binding is by ultrasonic welding.

26. The apparatus according to claim 15 wherein said base resin comprises a flame-retardant material.

27. The apparatus according to claim 15 further comprising a metal layer overlying said conductive loaded resin-based material.

28. The apparatus according to claim 15 further comprising a chute or guide formed of said conductive loaded resin-based material.

* * * * *